(12) United States Patent
Chen et al.

(10) Patent No.: US 11,127,546 B2
(45) Date of Patent: Sep. 21, 2021

(54) KEYBOARD

(71) Applicant: Chicony Electronics Co., Ltd., New Taipei (TW)

(72) Inventors: Tao-Kuan Chen, New Taipei (TW); Tzu-Chuan Liang, New Taipei (TW); Yi-Feng Chang, New Taipei (TW)

(73) Assignee: Chicony Electronics Co., Ltd., New Taipei (TW)

( * ) Notice: Subject to any disclaimer, the term of this patent is extended or adjusted under 35 U.S.C. 154(b) by 0 days.

(21) Appl. No.: 16/664,969

(22) Filed: Oct. 28, 2019

(65) Prior Publication Data

US 2020/0365349 A1 Nov. 19, 2020

(30) Foreign Application Priority Data

May 14, 2019 (TW) .................................. 108116614

(51) Int. Cl.
*H03K 17/969* (2006.01)
*H01H 13/83* (2006.01)
*H01H 13/7057* (2006.01)

(52) U.S. Cl.
CPC ........ *H01H 13/7057* (2013.01); *H01H 13/83* (2013.01); *H03K 17/969* (2013.01)

(58) Field of Classification Search
CPC .. H01H 13/7057; H01H 13/83; H01H 13/023; H01H 2215/006; H03K 17/969; H03K 17/968; H03K 17/78
See application file for complete search history.

(56) References Cited

U.S. PATENT DOCUMENTS

| | | | | |
|---|---|---|---|---|
| 3,235,741 | A * | 2/1966 | Plaisance | B41J 5/08 250/229 |
| 3,949,219 | A * | 4/1976 | Crouse | H01H 11/0012 250/229 |
| 5,952,648 | A * | 9/1999 | Worm | H03K 17/968 250/222.1 |
| 8,766,122 | B2 * | 7/2014 | Takiguchi | H01H 3/62 200/341 |
| 9,293,278 | B2 * | 3/2016 | Bokma | H03K 17/9622 |
| 9,646,786 | B1 * | 5/2017 | Feng | H01H 13/86 |
| 9,838,006 | B2 * | 12/2017 | Chen | H03K 17/78 |
| 10,263,618 | B2 * | 4/2019 | Li | H01H 13/70 |
| 2020/0051759 | A1 * | 2/2020 | Hsieh | H01H 13/7065 |

* cited by examiner

*Primary Examiner* — Felix O Figueroa
(74) *Attorney, Agent, or Firm* — CKC & Partners Co., LLC

(57) ABSTRACT

A keyboard includes an elastic element disposed above a bottom case, a light emitter, a light receiver, a pressing element, and a keycap. When a force toward the bottom case is applied to a top surface of the elastic element, a relationship between a force to move the top surface and a distance from the top surface to the bottom case is in a negative correlation in a path of the top surface from a first position to a second position, and a relationship between a force to move the top surface and a distance from the top surface to the bottom case is in a positive correlation in a path of the top surface from the second position to a third position. The light emitter, the light receiver, and the pressing element are disposed above the elastic element. The keycap is disposed above the pressing element.

18 Claims, 7 Drawing Sheets

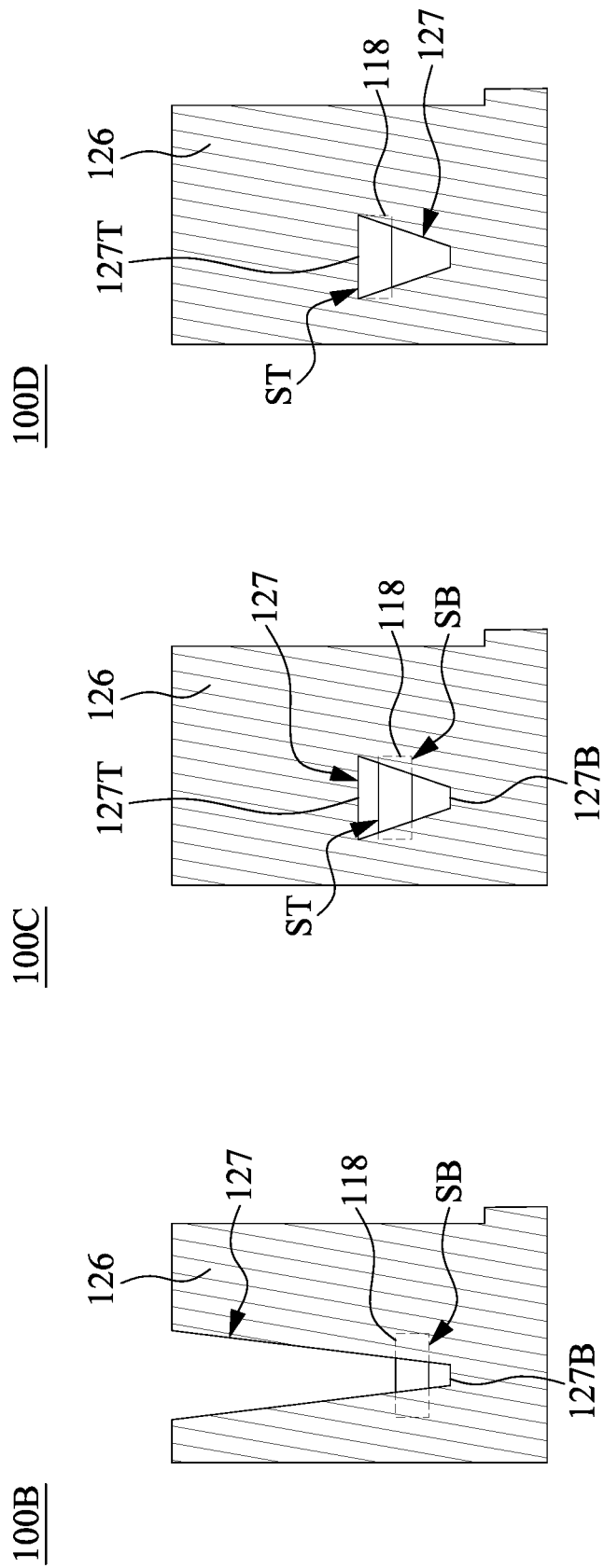

KEYBOARD

RELATED APPLICATIONS

This application claims priority to Taiwanese Application Ser. No. 108116614, filed May 14, 2019, which is herein incorporated by reference.

BACKGROUND

Technical Field

The present disclosure relates to a keyboard.

Description of Related Art

Currently, keyboards may serve as one of indispensable input devices to enter text or numbers while using a personal computer (PC). Moreover, consumer electronic products used in daily life require the keyboards as input devices so as to be operated. For operation mechanism of the keyboards, when a user presses a keyswitch of a keyboard, it will trigger an electronic switch in the keyswitch, such that the keyswitch can output a signal representing the pressing action. For example, when a keyswitch is pressed, the keyswitch can output a high level signal through an electronic switch.

In this regard, for the signal outputted from the key, it would be configured to determine whether the keyswitch is pressed but cannot determine how the pressing degree is. Furthermore, if pressing degree to be determined is considered, pressing experience provided by the keyswitch to the user would also become more important. Therefore, how to improve the current keyboards has become a research-and-development direction in the related field.

SUMMARY

An aspect of the present disclosure is to provide a keyboard including an elastic element, a light emitter, a light receiver, a pressing element, and a keycap. The elastic element is disposed above a bottom case and has a top surface. When a force toward the bottom case is applied to the top surface, a relationship between a force to move the top surface and a distance from the top surface to the bottom case is in a negative correlation in a path of the top surface moving with respect to the bottom case from a first position to a second position, and a relationship between a force to move the top surface and a distance from the top surface to the bottom case is in a positive correlation in a path of the top surface moving with respect to the bottom case from the second position to a third position. The light emitter is disposed above the elastic element. The light receiver is disposed above the elastic element. The pressing element is disposed above the elastic element and movable with respect to the bottom case. The pressing element has a first inner wall located on an optical path between the light emitter and the light receiver and has an opening, and the width of the opening varies along a direction away from the elastic element. The keycap is disposed above the pressing element.

In some embodiments, when a lower boundary of the opening is in a position higher than a lower surface of the light receiver, a position of the top surface with respect to the bottom case is located between the first position and the second position.

In some embodiments, when a lower boundary of the opening is in a position lower than a lower surface of the light receiver, a position of the top surface with respect to the bottom case is located between the second position and the third position.

In some embodiments, when a lower boundary of the opening aligns with a lower surface of the light receiver, a position of the top surface with respect to the bottom case is located between the first position and the third position.

In some embodiments, the elastic element further has a stop surface facing the bottom case. The pressing element further has at least one frame. The at least one frame is located above the light emitter and has a bottom surface that faces the light emitter. A distance from the stop surface to the bottom case is less than or equal to a distance from the bottom surface to the light emitter.

In some embodiments, the pressing element further has another frame located above the light receiver and having a bottom surface that faces the light receiver. A distance from the stop surface to the bottom case is less than or equal to a distance from the bottom surface of the another frame to the light receiver.

In some embodiments, the keyboard further includes a substrate and a top case. The substrate is disposed above the elastic element and has a hole, in which the pressing element has a bottom portion at least partially located in the hole. The top case is disposed above the substrate and has a position limiter. The position limiter extends to the top of the hole, and the bottom portion of the pressing element extends to the bottom of the position limiter.

In some embodiments, the top surface of the elastic element abuts against the first inner wall of the pressing element.

In some embodiments, the light emitter and the light receiver are disposed on the substrate.

In some embodiments, the elastic element is fixed at the bottom case, and a material of the elastic element is different than a material of the bottom case.

In some embodiments, the keyboard further includes an illuminating element disposed between the elastic element and the keycap. The pressing element further has a second inner wall connecting the first inner wall, and the second inner wall is located between the illuminating element and the light emitter and located between the illuminating element and the light receiver.

In some embodiments, the pressing element further has a second inner wall connecting the first inner wall and having a pair of protruding portions. The protruding portions are located above the top surface and protrude along a direction away from the first inner wall, and the first inner wall and the pair of the protruding portions are in contact with two areas of the top surface.

In some embodiments, the elastic element further has a stop surface facing the bottom case. When a position of the top surface with respect to the bottom case is located at the first position, the force toward the bottom case applied to the top surface is zero. When a position of the top surface with respect to the bottom case is located at the third position, the stop surface is in contact with the bottom case.

In some embodiments, the elastic element has a sidewall. When a position of the top surface with respect to the bottom case is located at the second position, a force that the sidewall of the elastic element is bearing is a maximum force that the sidewall of the elastic element can bear.

In some embodiments, in the path of the top surface moving with respect to the bottom case from the first position to the second position, an overlapping area between the opening and the optical path increases both in a vertical direction and in a horizontal direction. In the path of the top surface moving with respect to the bottom case from the second position to the third position, an overlapping area between the opening and the optical path increases merely in the horizontal direction.

In some embodiments, the pressing element includes a plurality of frames connected together and surrounds the first inner wall.

BRIEF DESCRIPTION OF THE DRAWINGS

FIG. 5 is a schematic diagram illustrating a relative position between a light receiver and an opening of a first inner wall of a keyboard according to a second embodiment of the present disclosure;

FIG. 6 is a schematic diagram illustrating a relative position between a light receiver and an opening of a first inner wall of a keyboard according to a third embodiment of the present disclosure; and FIG. 7 is a schematic diagram illustrating a relative position between a light receiver and an opening of a first inner wall of a keyboard according to a fourth embodiment of the present disclosure.

DETAILED DESCRIPTION

Figure 1A:
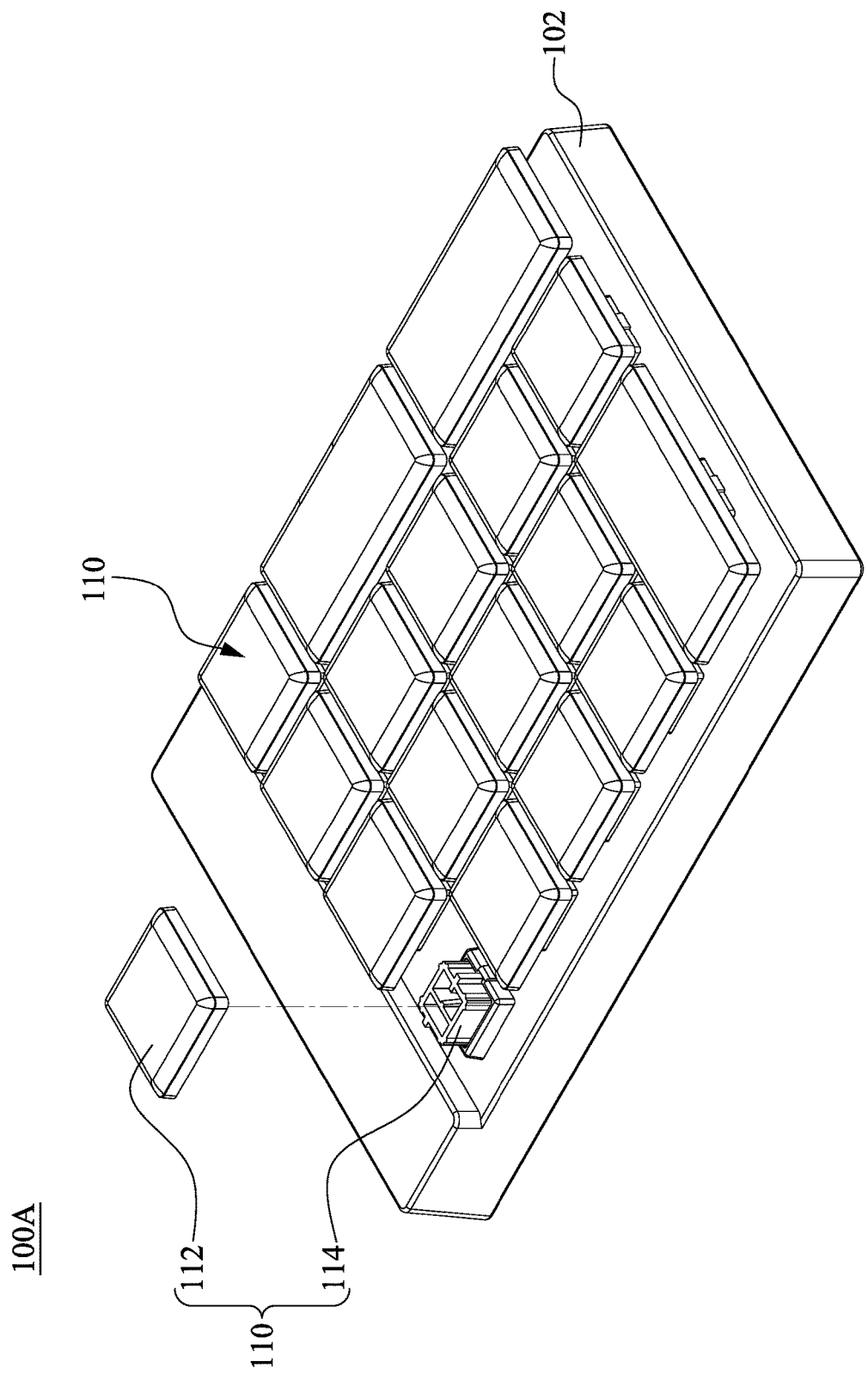
FIG. 1A is a schematic perspective view illustrating a keyboard according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

It will be understood that, although the terms "first," "second," etc., may be used herein to describe various elements, components, areas, or layers, these elements should not be limited by these terms. These terms are used to distinguish one element, component, area, or layer from another. For example, a first element could be termed a second element, and, similarly, a second element could be termed a first element, without departing from the scope of the embodiments. As used herein, the term "and/or" includes any and all combinations of one or more of the associated listed items. Furthermore, as used herein, the term "connect" includes "directly connect" and "indirectly connect". For example, when a first component is directly connected to a second component, the first component is in physical contact with the second component. For example, when a first component is indirectly connected to a second component, there is a third component located between the first component and the second component, and the third component is in physical contact with the first component and the second component.

A keyboard of the present disclosure can determine whether a pressing action has been performed in accordance with if a light receiver of a keyswitch receives a light beam and can further determine how pressing degree is in accordance with luminous flux of the light beam received by the light receiver. Moreover, the keyboard has an elastic element arranging for improving a pressing experience that the keyboard provides for a user.

Figure 1B:
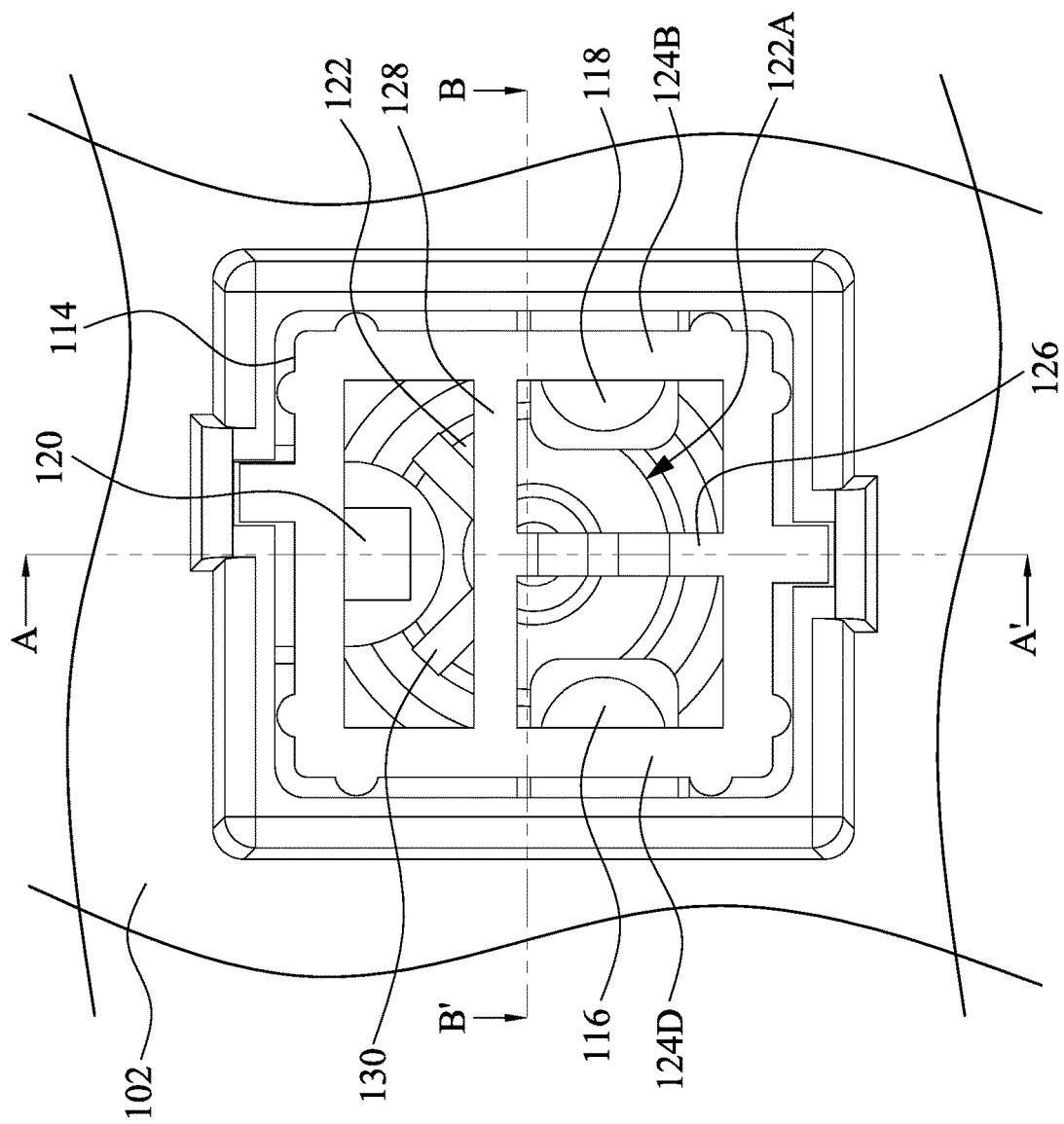
FIG. 1B is a schematic top view illustrating a keyswitch in FIG. 1A with a keycap detached therefrom.

Reference is made to FIGS. 1A and 1B. FIG. 1A is a schematic perspective view illustrating a keyboard 100A according to a first embodiment of the present disclosure, and FIG. 1B is a schematic top view illustrating a keyswitch 110 in FIG. 1A with a keycap 112 detached therefrom.

The keyboard 100A of the present disclosure can serve as an external keyboard (e.g., a keyboard with a PS/2 interface or a keyboard with a USB interface) used in a desktop computer, or can serve as an input device of a computer system (e.g., a touch pad on a notebook computer) having keyswitches, but the present disclosure is not limited thereto. That is, concepts of the keyboard 100A of the present disclosure can be applied to any electronic product that performs input function by pressing.

The keyboard 100A includes a top case 102 and keyswitches 110 which are assembled together, in which each of the keyswitches 110 extends from a position lower than the top case 102 to a position higher than the top case 102. Each of the keyswitches 110 includes a keycap 112, a pressing element 114, a light emitter 116, a light receiver 118, an illuminating element 120, and an elastic element 122. The keycap 112 is disposed above the top case 102. The pressing element 114 can extend from a position lower than the top case 102 to a position higher than the top case 102. The pressing element 114 is disposed to pass through an opening of the top case 102 and is movable with respect to the top case 102. The light emitter 116, the light receiver 118, the illuminating element 120, and the elastic element 122 are disposed below the top case 102. For facilitating understanding, the keycap 112 and the pressing element 114 of the keyswitch 110 in FIG. 1A are illustrated as being detached from each other.

The keycap 112 is assembled to the pressing element 114 along the dot line shown in FIG. 1A, such that the keycap 112 can be directly or indirectly connected to the pressing element 114 and be located above the pressing element 114. When a user presses the keycap 112 of the keyswitch 110, the keycap 112 can push the pressing element 114 to move the pressing element 114, whereby the keyswitch 110 can output a signal that can represent the pressing action, in which the signal may be varied according to pressing degree of the pressing action. The mechanism that the keyswitch 110 outputs the signal representing the pressing action is described as follows.

Figure 2A:
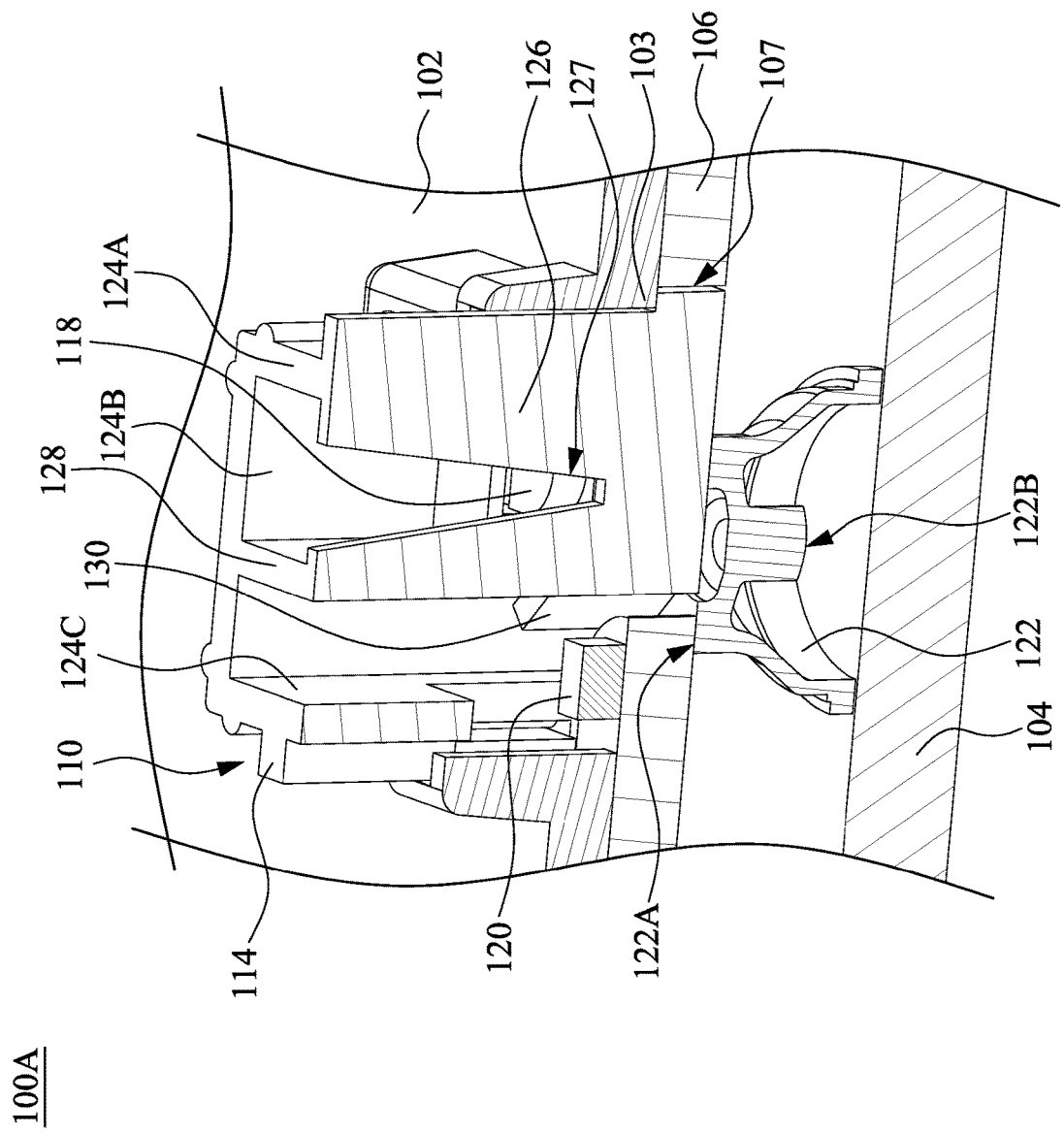
FIG. 2A is a cross-sectional view of the keyboard taken along line A-A' in FIG. 1B.
Figure 2B:
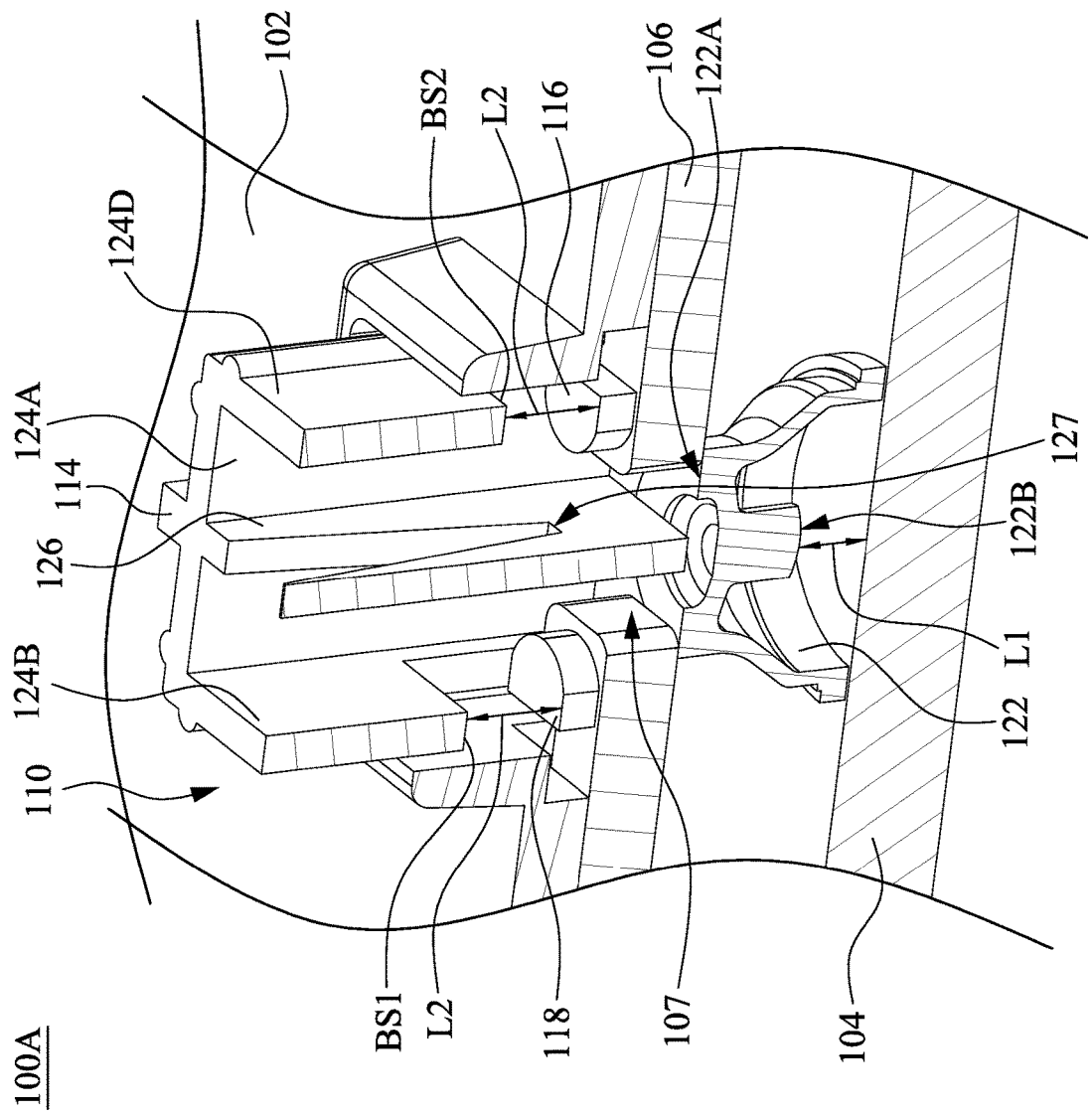
FIG. 2B is a cross-sectional view of the keyboard taken along line B-B' in FIG. 1B.

Reference is made to FIGS. 2A and 2B. FIG. 2A is a cross-sectional view of the keyboard 100A taken along line A-A' in FIGS. 1B and 2B is a cross-sectional view of the keyboard 100A taken along line B-B' in FIG. 1B. In order not to make FIGS. 2A and 2B too complex, the keycap 112 in FIG. 1A is omitted in FIGS. 2A and 2B. The keyboard 100A further includes a bottom case 104. The bottom case 104 can serve as a bottom board of the keyboard 100A and can be connected to the top case 102, so as to form an accommodating space therebetween.

The elastic element 122 of the keyswitch 110 is disposed on the bottom case 104 and is fixed to the bottom case 104. The elastic element 122 has a top surface 122A and a stop surface 122B. The top surface 122A faces away from the bottom case 104 and the stop surface 122B faces the bottom case 104. The top surface 122A and the stop surface 122B of the elastic element 122 are movable with respect to the e bottom case 104. Specifically, when the top surface 122A of the elastic element 122 is pressed, deformation of the elastic element 122 may occur due to the elasticity of the elastic element 122, such that the top surface 122A and the stop surface 122B can get close to the bottom case 104.

The elastic element 122 can be individually arranged and fixed at the bottom case 104. That is, the elastic element 122 and the bottom case 104 are not formed in one-piece, and a material of the elastic element 122 is different than a material of the bottom case 104. Such arrangement would be advantageous to replacement of the elastic element 122. For example, when a single elastic element of the keyboard 100A is broken, replacement to the broken elastic element can be individually performed with keeping the same bottom case 104. In addition, the material of the elastic element 122 may include rubber, and the structure of the elastic element 122 can be built by a sidewall having elasticity and by a hollow cavity that is defined by the sidewall. For example, the structure of the elastic element 122 can be achieved by using a rubber dome.

Figure 3:
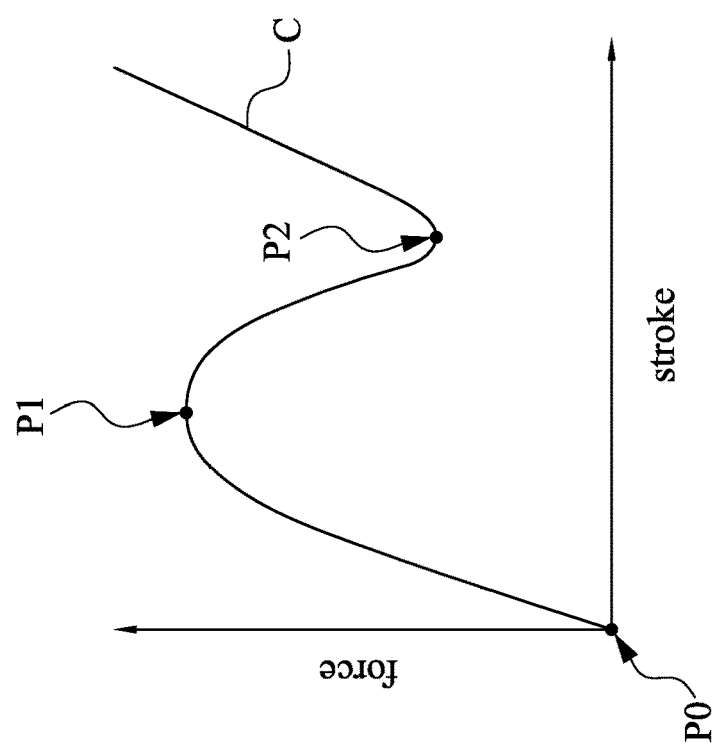
FIG. 3 is a diagram for showing force-stroke profile of the elastic element.

The elastic element 122 has a peak force and a contact force in force-stroke profile thereof. In this regard, reference can be made to FIG. 3 which is a diagram for showing force-stroke profile of the elastic element 122. As shown in FIG. 3, the horizontal axis of the force-stroke profile represents a stroke of the elastic element 122, and thus the horizontal axis may be taken as a pressed distance of the top surface 122A of the elastic element 122. The vertical axis of the force-stroke profile represents a force to move the top surface 122A of the elastic element 122. Coordinates P0, P1, and P2 are labeled in a curve C of FIG. 3, in which the coordinate P0 coincides with the original in FIG. 3.

Each of the coordinates may express different state of the elastic element 122. Specifically, when the top surface 122A of the elastic element 122 has not been pressed, the force-stroke profile of the elastic element 122 may correspond to the coordinate P0. When the top surface 122A of the elastic element 122 starts to be pressed, the force-stroke profile of the elastic element 122 can start to move from the coordinate P0 toward the coordinate P1 along the curve C. At this time, a relationship between a force to move the top surface 122A and a pressed depth of the top surface 122A is in a positive correlation. When the top surface 122A of the elastic element 122 is continuously pressed such that the force-stroke profile thereof corresponds to the coordinate P1, it would reach a peak point of the curve C. This peak point can be referred to as the peak force and can represent a maximum force that the sidewall of the elastic element 122 can bear.

When the top surface 122A of the elastic element 122 is further pressed, the force-stroke profile of the elastic element 122 can start to move from the coordinate P1 toward the coordinate P2 along the curve C. At this time, a relationship between a force to move the top surface 122A and a pressed depth of the top surface 122A is in a negative correlation, which would be resulted from that the sidewall of the elastic element 122 starts to be bended and thus cannot bear the force. When the top surface 122A of the elastic element 122 is continuously pressed such that the force-stroke profile thereof corresponds to the coordinate P2, it would reach a bottom point of the curve C. This bottom point can be referred to as the contact force and can represent that the stop surface 122B of the elastic element 122 is in contact with the bottom case 104.

Reference is made back to FIGS. 2A and 2B. The keyboard 100A can further include a substrate 106. The substrate 106 is disposed above the bottom case 104 and the elastic element 122. The substrate 106 may have a hole 107 that is arranged on and aimed at the elastic element 122. The top case 102 is disposed to cover the substrate 106 and in contact with the substrate 106. The substrate 106 may be a circuit board including a circuit layer or a digital/analog component (not illustrated). In addition, when the keyswitch 110 has not been pressed, the top surface 122A of the elastic element 122 can abut against the pressing element 114, such that the pressing element 114 which has not been pressed can be kept at a specific horizontal location in an initial state thereof.

The light emitter 116, the light receiver 118, and the illuminating element 120 are disposed on the substrate 106 and above the elastic element 122. Specifically, the light emitter 116, the light receiver 118, and the illuminating element 120 can be located between the elastic element 122 and the keycap (e.g., the keycap 112 in FIG. 1A) and be fixed to the substrate 106, thereby electrically connecting to the circuit layer of the substrate 106.

The light emitter 116 may include a light source, such as organic or inorganic light-emitting diode, so that the light emitter 116 can be configured to provide a light beam. The light receiver 118 may include a light detector, such as a photo diode (PD), so that the light receiver 118 can be configured to receive the light beam and then convert it into an electrical signal for outputting. The amplitude of the electrical signal outputted by the light receiver 118 is related to the luminous flux of the light beam received by the light receiver 118, such as a positive or negative correlation.

The light emitter 116 and the light receiver 118 are aligned with each other. Herein, the phrase "the light emitter 116 and the light receiver 118 are aligned with each other" may mean that the light beam provided by the light emitter 116 can be directly received by the light receiver 118 when there is no blocking object between the light emitter 116 and the light receiver 118.

The illuminating element 120 may be an organic or inorganic light-emitting diode, which can provide with illumination. Such illumination may be leaked out from a gap between the top case 102 and the pressing element 114, from the top case 102, and from the keycap (e.g., the keycap 112 in FIG. 1A), thereby improving a visual effect providing for the user.

The pressing element 114 is movable with respect to the light emitter 116, the light receiver 118, the illuminating element 120, the elastic element 122, and the bottom case 104. The pressing element 114 has frames 124A, 124B, 124C, and 124D, a first inner wall 126, and a second inner wall 128 which are connected together. The frames 124A, 124B, 124C, and 124D collectively form a boundary with a rectangular profile, as shown in FIG. 1B, and surround the first inner wall 126 and the second inner wall 128. The first inner wall 126 extends from the frame 124A toward the frame 124C to connect the second inner wall 128, and the first inner wall 126 is located in an optical path between the light emitter 116 and the light receiver 118.

The first inner wall 126 has an opening 127, and the width of the opening 127 varies along a direction away from the elastic element 122. In the present embodiment, the width of the opening 127 gradually increases along the direction away from the elastic element 122, such that the profile of the opening 127 is in an inverted trapezoid shape. In other embodiments, the width of the opening 127 may gradually decrease along the direction away from the elastic element 122, such that the profile of the opening 127 is in a trapezoid shape.

The second inner wall 128 extends from the frame 124B to the frame 124D, as shown in FIG. 1B, and the second inner wall 128 is located between the light emitter 116 and the illuminating element 120 and between the light receiver 118 and the illuminating element 120. By such arrangement, the second inner wall 128 can isolate the illuminating element 120 from the light emitter 116 and the light receiver 118, so as to prevent the illumination provided by the illuminating element 120 from affecting the optical couple relationship between the light emitter 116 and the light receiver 118.

The pressing element 114 can be supported by the top surface 122A of the elastic element 122. Specifically, the first inner wall 126 can be in contact with the top surface 122A of the elastic element 122, such that the top surface 122A of the elastic element 122 can apply a normal force to the first inner wall 126, thereby supporting the pressing element 114.

Moreover, as shown in FIGS. 1B and 2A, the second inner wall 128 may have a pair of protruding portions 130 located on the top surface 122A of the elastic element 122. The protruding portions 130 each protrude along a direction away from the first inner wall 126 and are in contact with the top surface 122A of the elastic element 122. In other words, the top surface 122A of the elastic element 122 can provide normal forces for the protruding portions 130 in addition to providing the normal force for the first inner wall 126, so as to further support the pressing element 114. In this regard, the first inner wall 126 and the pair of the protruding portions 130 are in contact with different areas of the top surface 122A of the elastic element 122 which are separated from each other, such that the top surface 122A of the elastic element 122 can provide the normal forces uniformly for the pressing element 114, so as to prevent the pressing element 114 from slanting due to uneven forces.

Reference is made back to FIGS. 2A and 2B. The pressing element 114 has a bottom portion at least partially located in the hole 107 of the substrate 106. The top case 102 has a position limiter 103. The position limiter 103 extends to the top of the hole 107, and a bottom portion of the pressing element 114 extends to the bottom of the position limiter 103. Therefore, the position limiter 103 of the top case 102 can provide a position-limit effect for the bottom portion of the pressing element 114, thereby preventing the pressing element 114 from being out of the hole 107.

By the arrangement above, when a user presses the keycap (e.g., the keycap 112 in FIG. 1A) of the keyswitch 110 to make the keycap push the pressing element 114 to move toward the elastic element 122, the opening 127 of the first inner wall 126 would move to a position in the optical path between the light emitter 116 and the light receiver 118 such that the light receiver 118 could receive the light beam provided by the light emitter 116. By this arrangement, in addition to taking whether the light receiver 118 receives the light beam as a determination base for the pressing action, the pressing degree of the pressing action can be determined according to the luminous flux of the received light beam.

Figure 4A:
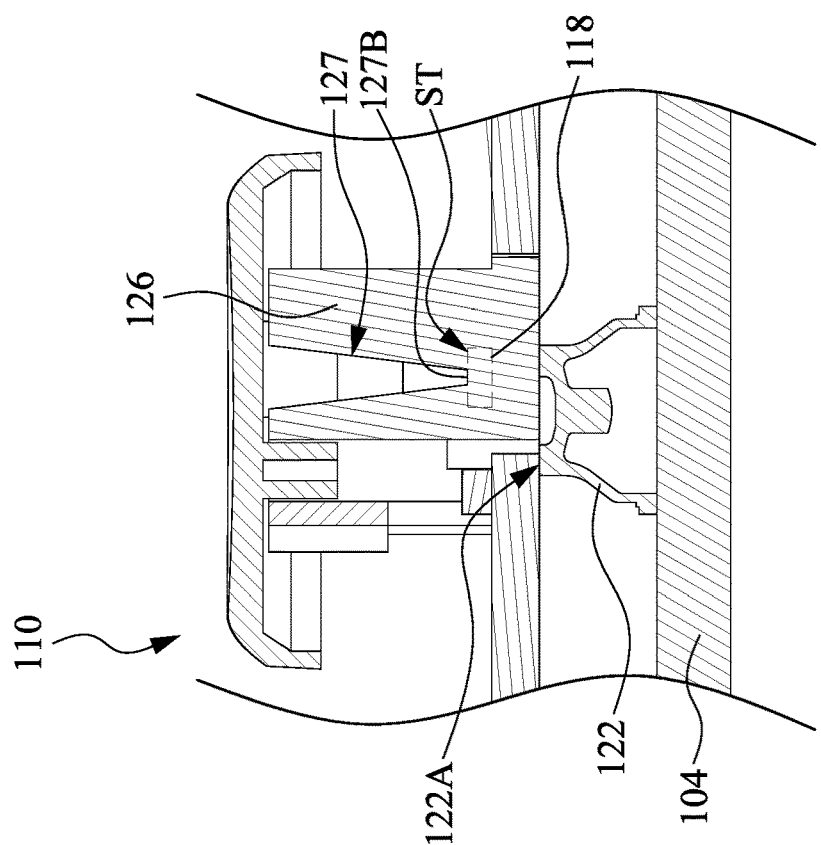
FIGS. 4A to 4C respectively are cross-sectional views of the keyswitch taken along line A-A' in FIG. 1B.
Figure 4C:
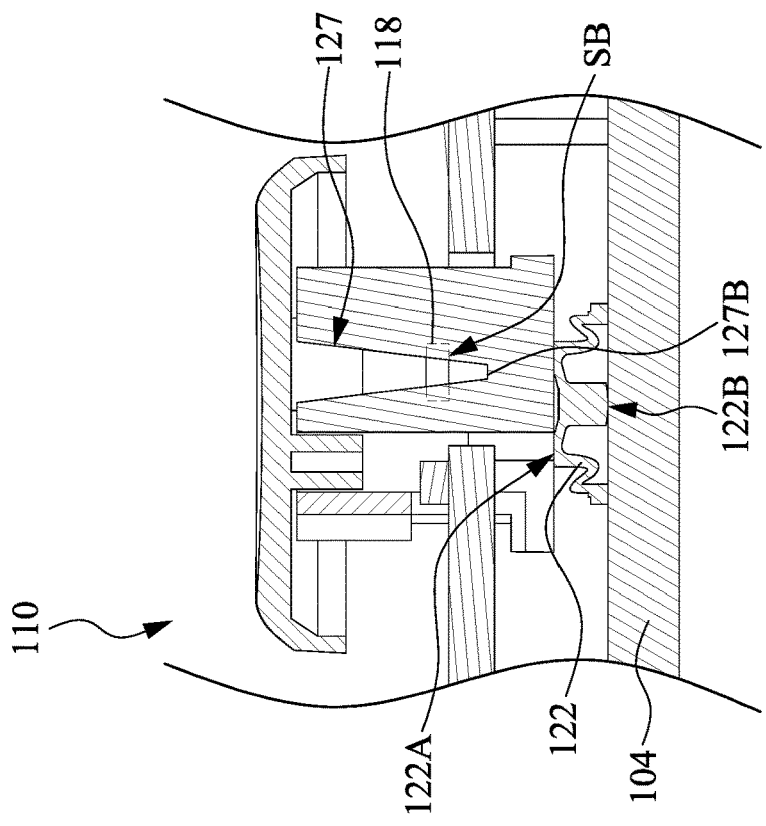
Figure 4B:
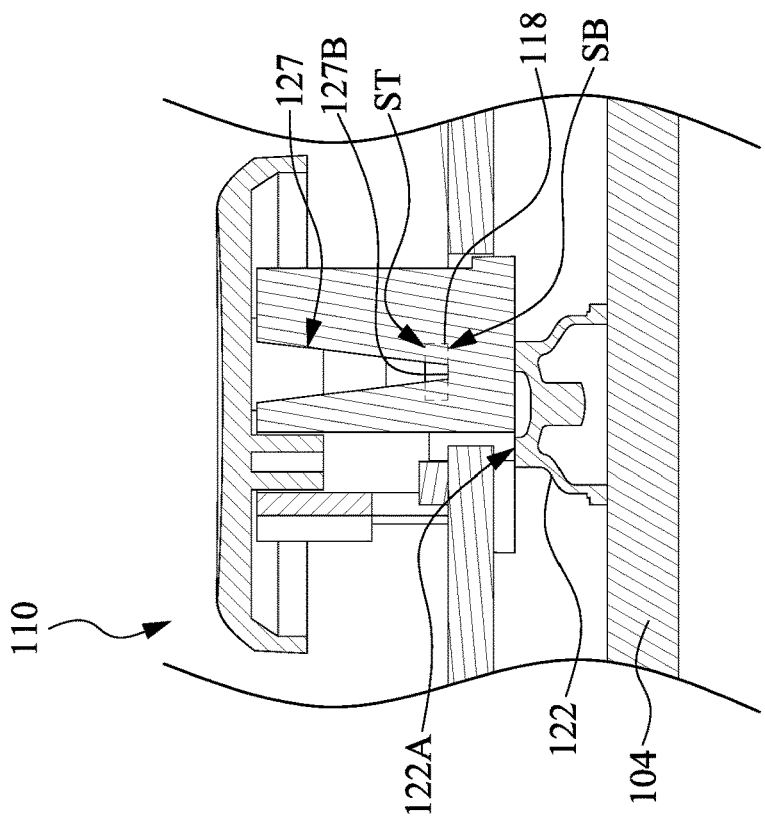

Reference is made to FIGS. 3 and 4A to 4C, in which FIGS. 4A to 4C respectively are cross-sectional views of the keyswitch 110 taken along line A-A' in FIG. 1B. In order to describe the instant embodiment, in the following descriptions, when the force-stroke profile of the elastic element 122 corresponds to the coordinate P0 in the curve C, it defines the position of the top surface 122A of the elastic element 122 with respect to the bottom case 104 as a first position; when the force-stroke profile of the elastic element 122 corresponds to the coordinate P1 in the curve C, it defines the position of the top surface 122A of the elastic element 122 with respect to the bottom case 104 as a second position; when the force-stroke profile of the elastic element 122 corresponds to the coordinate P2 in the curve C, it defines the position of the top surface 122A of the elastic element 122 with respect to the bottom case 104 as a third position.

As shown in FIGS. 3 and 4A, when the keyswitch 110 has not been pressed, a lower boundary 127B of the opening 127 of the first inner wall 126 would align with an upper surface ST of the light receiver 118. At this time, the position of the top surface 122A of the elastic element 122 with respect to the bottom case 104 corresponds to the first position. Since the lower boundary 127B of the opening 127 of the first inner wall 126 aligns with the upper surface ST of the light receiver 118, the first inner wall 126 can block the optical path from the light emitter (e.g., the light emitter 116 in FIG. 2B) to the light receiver 118, such that the light receiver 118 does not output an electrical signal or the light receiver 118 merely outputs a weak electrical signal.

As shown in FIGS. 3 and 4B, when the keyswitch 110 has been pressed for a distance, the lower boundary 127B of the opening 127 of the first inner wall 126 would align with a lower surface SB of the light receiver 118. At this time, the position of the top surface 122A of the elastic element 122 with respect to the bottom case 104 corresponds to the second position.

That is, when the lower boundary 127B of the opening 127 of the first inner wall 126 is in a position lower than the upper surface ST of the light receiver 118 and higher than the lower surface SB of the light receiver 118, the position of the top surface 122A of the elastic element 122 with respect to the bottom case 104 can correspondingly be located between the first position and the second position, and the force-stroke profile of the elastic element 122 corresponding to the curve C is between the coordinate P0 and the coordinate P1. Therefore, in a path of the top surface 122A from the first position to the second position with respect to the bottom case 104, when a force toward the bottom case 104 is applied to the top surface 122A due to pressing the keyswitch 110, a relationship between a force to move the top surface 122A and a distance from the top surface 122A to the bottom case 104 is in a negative correlation, and a relationship between a force provided by the user to press the keyswitch 110 and the pressed depth of the opening 127 is in a positive correlation.

In the path of the top surface 122A of the elastic element 122 moving from the first position to the second position with respect to the bottom case 104, when the opening 127 of the first inner wall 126 overlaps with the optical path from the light emitter (e.g., the light emitter 116 in FIG. 2B) to the light receiver 118, the light receiver 118 would receive the light beam from the light emitter 116. Moreover, the light receiver 118 can receive more luminous flux as the overlapping area between the opening 127 and the optical path increases. At this time, the light receiver 118 can output an electrical signal having corresponding amplitude in accordance with the luminous flux of the received light beam. By this mechanism, in addition to determining the pressing status according to whether the light receiver 118 receives the light beam, the pressing degree of the pressing action can be determined according to the luminous flux of the received light beam.

As shown in FIGS. 3 and 4C, when the keyswitch 110 has been pressed further, the lower boundary 127B of the opening 127 of the first inner wall 126 would be lower than the lower surface SB of the light receiver 118 and continuously move downward until the stop surface 122B of the elastic element 122 abuts against the bottom case 104. When the stop surface 122B of the elastic element 122 abuts against the bottom case 104, the position of the top surface 122A of the elastic element 122 with respect to the bottom case 104 corresponds to the third position.

That is, when the lower boundary 127B of the opening 127 of the first inner wall 126 is in a position lower than the lower surface SB of the light receiver 118, the position of the top surface 122A of the elastic element 122 with respect to the bottom case 104 can correspondingly be located between the second position and the third position, and the force-stroke profile of the elastic element 122 corresponding to the curve C is between the coordinate P1 and the coordinate P2. Therefore, in a path of the top surface 122A from the second position to the third position with respect to the bottom case 104, when a force toward the bottom case 104 is applied to the top surface 122A due to pressing the keyswitch 110, a relationship between a force to move the top surface 122A and a distance from the top surface 122A to the bottom case 104 is in a positive correlation, and a relationship between a force provided by the user to press the keyswitch 110 and the pressed depth of the opening 127 is in a negative correlation.

For the user's pressing experience, when the pressing action is performed such that the position of the top surface 122A of the elastic element 122 is located between the second position and the third position, the relationship between the force provided by the user to press the keyswitch 110 and the pressed depth of the opening 127 is in a negative correlation, which can make the user know that the pressible depth of the keyswitch 110 is close to an end position. Therefore, the arrangement above can achieve that avoid continuously applying force to the keyswitch 110 by the user, thereby preventing the pressing element 114 or the elastic element 122 from being damaged.

Furthermore, in the path of the top surface 122A of the elastic element 122 moving from the first position to the second position, the overlapping area between the opening 127 and the optical path increases in the vertical and horizontal directions. In the path of the top surface 122A of the elastic element 122 moving from the second position to the third position, the overlapping area between the opening 127 and the optical path increases merely in the horizontal direction.

Therefore, "a change of the luminous flux with respect to the pressed depth in each length unit" in the path of the top surface 122A from the first position to the second position may be greater than "a change of the luminous flux with respect to the pressed depth in each length unit" in the path of the top surface 122A from the second position to the third position. Accordingly, the sensitivity of the light receiver 118 with respect to the change of the pressing action or pressing degree in the path of the top surface 122A from the first position to the second position may be greater than the sensitivity of the light receiver 118 with respect to the change of the pressing action or pressing degree in the path of the top surface 122A from the second position to the third position. In other words, by designing the third position of the top surface 122A of the elastic element 122 as corresponding to the coordinate P2 of the force-stroke profile of the elastic element 122, the keyswitch 110 can have better sensitivity with respect to determination of the pressing degree.

Reference is made back to FIG. 2B. At the third position of the top surface 122A, the frames 124B and 124D of the pressing element 114 can be designed as being avoiding stressing the light receiver 118 and the light emitter 116. For example, the frame 124B located above the light receiver 118 may have a bottom surface BS1 facing the light receiver 118. The frame 124D located above the light emitter 116 may have a bottom surface BS2 facing the light emitter 116. In this regard, in the status that the keyswitch 110 has not been pressed, a distance L1 from the stop surface 122B of the elastic element 122 to the bottom case 104 is less than or equal to a distance L2 from the light emitter 116 or the light receiver 118 to the corresponding bottom surface. With this arrangement, when the pressing element 114 pushes the top surface 122A of the elastic element 122 to the third position, the frames 124B and 124D of the pressing element 114 would not stress the light receiver 118 and the light emitter 116, thereby avoiding damaging the light receiver 118 and the light emitter 116.

In the present embodiment, although the profile of the force-stroke profile of the elastic element 122 is described with the illustrations in FIG. 4A to FIG. 4C, the present disclosure is not limited thereto. In other embodiments, the positions of the top surface of the elastic element may correspond to other coordinates in the force-stroke profile of the elastic element.

Reference is made to FIG. 5 which is a schematic diagram illustrating a relative position between a light receiver 118 and an opening 127 of a first inner wall 126 of a keyboard 100B according to a second embodiment of the present disclosure. In order to describe conveniently, FIG. 5 merely illustrates the light receiver 118 and the first inner wall 126 of the pressing element, and other elements are the same as those of the first embodiment.

At least one difference between the present embodiment and the first embodiment is that the elastic element (e.g., the elastic element 122 in FIGS. 2A and 2B) would correspond to the coordinate P1 in the force-stroke profile thereof, when the lower boundary 127B of the opening 127 of the first inner wall 126 is in a position lower than the lower surface SB of the light receiver 118. In other words, in this case, when the lower boundary 127B of the opening 127 of the first inner wall 126 is in a position lower than the lower surface SB of the light receiver 118, the elastic element will reach the second position corresponding to the peak force.

Reference is made to FIG. 6 which is a schematic diagram illustrating a relative position between a light receiver 118 and an opening 127 of a first inner wall 126 of a keyboard 100C according to a third embodiment of the present disclosure. In order to describe conveniently, FIG. 6 merely illustrates the light receiver 118 and the first inner wall 126 of the pressing element, and other elements are the same as those of the first embodiment.

At least one difference between the present embodiment and the first embodiment is that the opening 127 of the first inner wall 126 is in an enclosed type (i.e., the opening 127 of the first inner wall 126 of the first embodiment is in an open type). Furthermore, in the present embodiment, the elastic element (e.g., the elastic element 122 in FIGS. 2A and 2B) would correspond to the coordinate P2 in the force-stroke profile thereof, when a vertical distance between the lower boundary 127B of the opening 127 of the first inner wall 126 and the lower surface SB of the light receiver 118 is greater than a vertical distance between an upper boundary 127T of the opening 127 of the first inner wall 126 and the upper surface ST of the light receiver 118. In other words, in this case, when the lower boundary 127B of the opening 127 of the first inner wall 126 is in a position lower than the lower surface SB of the light receiver 118 and the upper boundary 127T of the opening 127 of the first inner wall 126 is in a position higher than the upper surface ST of the light receiver 118, the elastic element will reach the third position corresponding to the contact force.

Reference is made to FIG. 7 which is a schematic diagram illustrating a relative position between a light receiver 118 and an opening 127 of a first inner wall 126 of a keyboard 100D according to a fourth embodiment of the present disclosure. In order to describe conveniently, FIG. 7 merely illustrates the light receiver 118 and the first inner wall 126 of the pressing element, and other elements are the same as those of the first embodiment.

At least one difference between the present embodiment and the first embodiment is that the opening 127 of the first inner wall 126 is in an enclosed type (i.e., the opening 127 of the first inner wall 126 of the first embodiment is in an open type). Furthermore, in the present embodiment, the elastic element (e.g., the elastic element 122 in FIGS. 2A and 2B) would correspond to the coordinate P2 in the force-stroke profile thereof, when the upper boundary 127T of the opening 127 of the first inner wall 126 aligns with the upper surface ST of the light receiver 118. In other words, in this case, when the upper boundary 127T of the opening 127 of the first inner wall 126 aligns with the upper surface ST of the light receiver 118, the elastic element will reach the third position corresponding to the contact force. Moreover, the maximum width of the opening 127 of the first inner wall 126 (i.e., the length of the upper boundary 127T of the opening 127) may be the same as the width of the light receiver 118, which will be advantageous to make the electrical signal outputted by the light receiver 118 more comply with the pressing stroke.

The arrangements of the embodiments above may be selected in accordance with the different situations, so as to make the keyboard comply with different using requirements. In addition, the disposed positions of the light emitter and the light receiver are exemplary, and the present disclosure is not limited thereto. In other embodiments, the disposed positions of the light emitter and the light receiver may be exchanged.

As described above, the keyboard of the present disclosure includes the elastic element, the light emitter, the light receiver, the pressing element, and the keycap. The pressing element is disposed on the elastic element and has the first inner wall that is located in the optical path between the light emitter and the light receiver and has the opening. The opening has the width that gradually varies along the direction away from the elastic element. When a user presses the keycap, the first inner wall would move and push the top surface of the elastic element, such that the light receiver can receive the light beam provided by the light emitter through the opening, thereby determining whether the pressing action is performed. Since the width of the opening gradually varies, the pressing degree of the pressing action can be determine in accordance with the luminous flux of the light beam received by the light receiver. The height of the boundary of the opening of the first inner wall can be adjusted according to the force-stroke profile of the elastic element, thereby improving the pressing experience that the keyboard provides for the user.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A keyboard, comprising:
   an elastic element disposed above a bottom case and having a top surface, wherein when a force toward the bottom case is applied to the top surface, a relationship between the force to move the top surface and a distance from the top surface to the bottom case is in a negative correlation in a path of the top surface moving with respect to the bottom case from a first position to a second position, and a relationship between the force to move the top surface and a distance from the top surface to the bottom case is in a positive correlation in a path of the top surface moving with respect to the bottom case from the second position to a third position;
   a light emitter disposed above the elastic element;
   a light receiver disposed above the elastic element;
   a pressing element disposed above the elastic element and movable with respect to the bottom case, wherein the pressing element has a first inner wall located in an optical path between the light emitter and the light receiver and having an opening, the opening has a lower boundary and a top end opposite to the lower boundary, the lower boundary is located between the top end and the elastic element, wherein along a direction away from the elastic element, a width of the opening increases from a first width defined by the lower boundary to a second width defined by the top end, wherein the keyboard is configured to determine a pressed depth of the pressing element according to a luminous flux of a light beam received by the light receiver, and wherein a change of the luminous flux with respect to the pressed depth in each length unit in the path of the top surface from the first position to the second position is greater than a change of the luminous flux with respect to the pressed depth in each length unit in the path of the top surface from the second position to the third position;
   a keycap disposed above the pressing element; and
   a circuit board disposed above the elastic element, wherein the light emitter and the light receiver are disposed on a side of the circuit board facing the keycap.

2. The keyboard of claim 1, wherein when the lower boundary of the opening is in a position higher than a lower surface of the light receiver, a position of the top surface with respect to the bottom case is located between the first position and the second position.

3. The keyboard of claim 1, wherein when the lower boundary of the opening is in a position lower than a lower surface of the light receiver, a position of the top surface with respect to the bottom case is located between the second position and the third position.

4. The keyboard of claim 1, wherein when the lower boundary of the opening aligns with a lower surface of the light receiver, a position of the top surface with respect to the bottom case is located between the first position and the third position.

5. The keyboard of claim 1, wherein the elastic element further has a stop surface facing the bottom case, the pressing element further has at least one frame, the at least one frame is located above the light emitter and has a bottom surface that faces the light emitter, and a distance from the stop surface to the bottom case is less than or equal to a distance from the bottom surface to the light emitter.

6. The keyboard of claim 5, wherein the pressing element further has another frame located above the light receiver and having a bottom surface that faces the light receiver, and a distance from the stop surface to the bottom case is less than or equal to a distance from the bottom surface of the another frame to the light receiver.

7. The keyboard of claim 1, wherein the circuit board has a hole and the pressing element has a bottom portion at least partially located in the hole, wherein the keyboard further comprises:
a top case disposed above the circuit board and having a position limiter, wherein the position limiter extends to the top of the hole, and the bottom portion of the pressing element extends to the bottom of the position limiter.

8. The keyboard of claim 7, wherein the top surface of the elastic element abuts against the first inner wall of the pressing element.

9. The keyboard of claim 1, wherein the elastic element is fixed at the bottom case, and a material of the elastic element is different than a material of the bottom case.

10. The keyboard of claim 1, further comprising:
an illuminating element disposed between the elastic element and the keycap, wherein the pressing element further has a second inner wall connecting the first inner wall, and the second inner wall is located between the illuminating element and the light emitter and located between the illuminating element and the light receiver.

11. The keyboard of claim 1, wherein the pressing element further has a second inner wall connecting the first inner wall and having a pair of protruding portions, the protruding portions are located above the top surface and protrude along a direction away from the first inner wall, and the first inner wall and the pair of the protruding portions are in contact with two areas of the top surface.

12. The keyboard of claim 1, wherein the elastic element further has a stop surface facing the bottom case; when a position of the top surface with respect to the bottom case is located at the first position, the force toward the bottom case applied to the top surface is zero; when a position of the top surface with respect to the bottom case is located at the third positon, the stop surface is in contact with the bottom case.

13. The keyboard of claim 12, wherein the elastic element has a sidewall; when a position of the top surface with respect to the bottom case is located at the second positon, a force that the sidewall of the elastic element is bearing is a maximum force that the sidewall of the elastic element can bear.

14. The keyboard of claim 1, wherein in the path of the top surface moving with respect to the bottom case from the first positon to the second position, an overlapping area between the opening and the optical path increases both in a vertical direction and in a horizontal direction; in the path of the top surface moving with respect to the bottom case from the second positon to the third position, an overlapping area between the opening and the optical path increases merely in the horizontal direction.

15. The keyboard of claim 1, wherein the pressing element comprises a plurality of frames connected together and surrounds the first inner wall.

16. A keyboard, comprising:
an elastic element disposed above a bottom case and having a top surface, wherein when a force toward the bottom case is applied to the top surface, a relationship between the force to move the top surface and a distance from the top surface to the bottom case is in a negative correlation in a path of the top surface moving with respect to the bottom case from a first position to a second position, and a relationship between the force to move the top surface and a distance from the top surface to the bottom case is in a positive correlation in a path of the top surface moving with respect to the bottom case from the second position to a third position;
a light emitter disposed above the elastic element;
a light receiver disposed above the elastic element;
a pressing element disposed above the elastic element and movable with respect to the bottom case, wherein the pressing element has a first inner wall located in an optical path between the light emitter and the light receiver and having an opening, the opening has a lower boundary and a top end opposite to the lower boundary, the lower boundary is located between the top end and the elastic element, wherein along a direction away from the elastic element, a width of the opening increases from a first width defined by the lower boundary to a second width defined by the top end, wherein the keyboard is configured to determine a pressed depth of the pressing element according to a luminous flux of a light beam received by the light receiver, and wherein a change of the luminous flux with respect to the pressed depth in each length unit in the path of the top surface from the first position to the second position is greater than a change of the luminous flux with respect to the pressed depth in each length unit in the path of the top surface from the second position to the third position; and
a keycap disposed above the pressing element;
wherein the opening of the pressing element has an inverted trapezoid shape, and the width of the opening increases over an entire opening length thereof.

17. The keyboard of claim 16, wherein the pressing element has a pressing element length, the first inner wall of the pressing element has a first inner wall length measured from a lowermost edge to an uppermost edge of the first inner wall, the pressing element length is substantially equal to the first inner wall length, the lower boundary of the opening is closer to the lowermost edge of the first inner wall than the top end of the opening and is spaced apart from the lowermost edge of the first inner wall, and the top end of the opening is formed at the uppermost edge of the first inner wall.

18. The keyboard of claim 17, further comprising a substrate disposed above the bottom case, wherein:
the light receiver is positioned on one side of the first inner wall of the pressing element opposing said one side of the first inner wall, the light emitter is positioned on another side of the first inner wall of the pressing element opposing said another side of the first inner wall;
each of the light receiver and the light emitter is disposed on an upper surface of the substrate, such that a height of the light receiver with respect to the bottom case is substantially equal to a height of the light emitter with respect to the bottom case; and
the light receiver is symmetrically arranged with respect to the opening as the pressed depth of the pressing element is varied and the top surface of the elastic element undergoes movement among the first position, the second position, and the third position.

* * * * *